US012627306B2

(12) United States Patent
Bahr et al.

(10) Patent No.: US 12,627,306 B2
(45) Date of Patent: \*May 12, 2026

(54) OSCILLATOR CALIBRATED TO A MICROELECTROMECHANICAL SYSTEM (MEMS) RESONATOR-BASED OSCILLATOR

(71) Applicant: TEXAS INSTRUMENTS INCORPORATED, Dallas, TX (US)

(72) Inventors: Bichoy Bahr, Allen, TX (US); Yogesh Ramadass, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/821,218

(22) Filed: Aug. 30, 2024

(65) Prior Publication Data

US 2024/0421825 A1 Dec. 19, 2024

Related U.S. Application Data

(63) Continuation of application No. 17/936,505, filed on Sep. 29, 2022, now Pat. No. 12,095,471.

(51) Int. Cl.
*H03L 7/099* (2006.01)
*H03B 5/32* (2006.01)
(Continued)

(52) U.S. Cl.
CPC ........... *H03L 7/0995* (2013.01); *H03B 5/326* (2013.01); *H03H 9/02244* (2013.01);
(Continued)

(58) Field of Classification Search
CPC ....... H03L 7/0995; H03L 7/085; H03B 5/326; H03H 9/02244; H03K 3/0231; H03M 1/46

See application file for complete search history.

(56) References Cited

U.S. PATENT DOCUMENTS 8,570,113 B2 10/2013 Fischette
11,115,036 B1 9/2021 Zhao
(Continued)

OTHER PUBLICATIONS

B. Bahr, D. Griffith, A. Kiaei, T. Tsai, R. Smith and B. Haroun, "Class-C BAW Oscillator Achieving a Close-in FOM of 206.5dB at 1KHz with Optimal Tuning for Narrowband Wireless Systems," 2022 IEEE Radio Frequency Integrated Circuits Symposium (RFIC), 2022, pp. 311-314, doi: 10.1109/RFIC54546.2022.9863092.

(Continued)

*Primary Examiner* — Jeffrey M Shin

(74) *Attorney, Agent, or Firm* — Zhenhai Fu; Frank D. Cimino

(57) ABSTRACT

In one example, an apparatus comprises an oscillator having a control input and a clock output. The apparatus also comprises a frequency control circuit having an input and a control output, the control output coupled to the control input, and a reference clock generator having a reference clock output. The apparatus also comprises a multiplexer having a first multiplexer input, a second multiplexer input, a selection input, and a multiplexer output, the first multiplexer input coupled to the clock output, the second multiplexer input coupled to the reference clock output, and the multiplexer output coupled to the input of the frequency control circuit.

21 Claims, 6 Drawing Sheets

(51) Int. Cl.

| | | |
|---|---|---|
| *H03H 9/02* | (2006.01) | |
| *H03K 3/0231* | (2006.01) | |
| *H03L 7/085* | (2006.01) | |
| *H03M 1/46* | (2006.01) | |

(52) U.S. Cl.
CPC ........... *H03K 3/0231* (2013.01); *H03L 7/085*
(2013.01); *H03M 1/46* (2013.01)

(56) References Cited

U.S. PATENT DOCUMENTS

| 12,095,471 | B2 * | 9/2024 | Bahr | .................. | H03H 9/02244 |
|---|---|---|---|---|---|
| 2009/0091398 | A1 | 4/2009 | Satoh | | |
| 2017/0149386 | A1 | 5/2017 | Haroun | | |

OTHER PUBLICATIONS

IEEE Journal of Solid-State Circuits, "A 32-MHz, 34 micro-watt Temperature-Compensated RC Oscillator Using Pulse Density Modulated Resistors," Amr Khashaba, Nilanjan Pal, Mostafa Ahmed, Pavan Hanumolu, pp. 1-9.

* cited by examiner

OSCILLATOR CALIBRATED TO A MICROELECTROMECHANICAL SYSTEM (MEMS) RESONATOR-BASED OSCILLATOR

CROSS-REFERENCE TO RELATED APPLICATION

This nonprovisional application is a continuation of U.S. patent application Ser. No. 17/936,505, filed Sep. 29, 2022, which is hereby incorporated by reference in its entirety.

BACKGROUND

Oscillators generate clock signals used in a variety of applications with varying degrees of accuracy and stability requirements. One type of oscillator is a crystal oscillator. However, crystal oscillators are bulky, costly, and difficult to integrate on a semiconductor device containing the circuitry using the clock signal. A resistor-capacitor (R-C) oscillator can be integrated on the same die as the circuit using its clock signal but suffers from stability problems, high Allan deviation (representing fractional frequency fluctuation), high temperature coefficient of frequency (TCF), and random telegraph noise (RTN).

SUMMARY

In one example, a clock circuit includes a voltage-controlled oscillator (VCO) having a control input and a first clock output. The clock circuit includes a frequency-locked loop (FLL) having an FLL input and a control output, the control output coupled to the control input. A microelectromechanical system (MEMS) resonator-based oscillator has a second clock output. A multiplexer has a first multiplexer input, a second multiplexer input, a selection input, and a multiplexer output. The first multiplexer input is coupled to the first clock output. The second multiplexer input is coupled to the second clock output. The multiplexer output is coupled to the FLL input.

DETAILED DESCRIPTION

Figure 1:
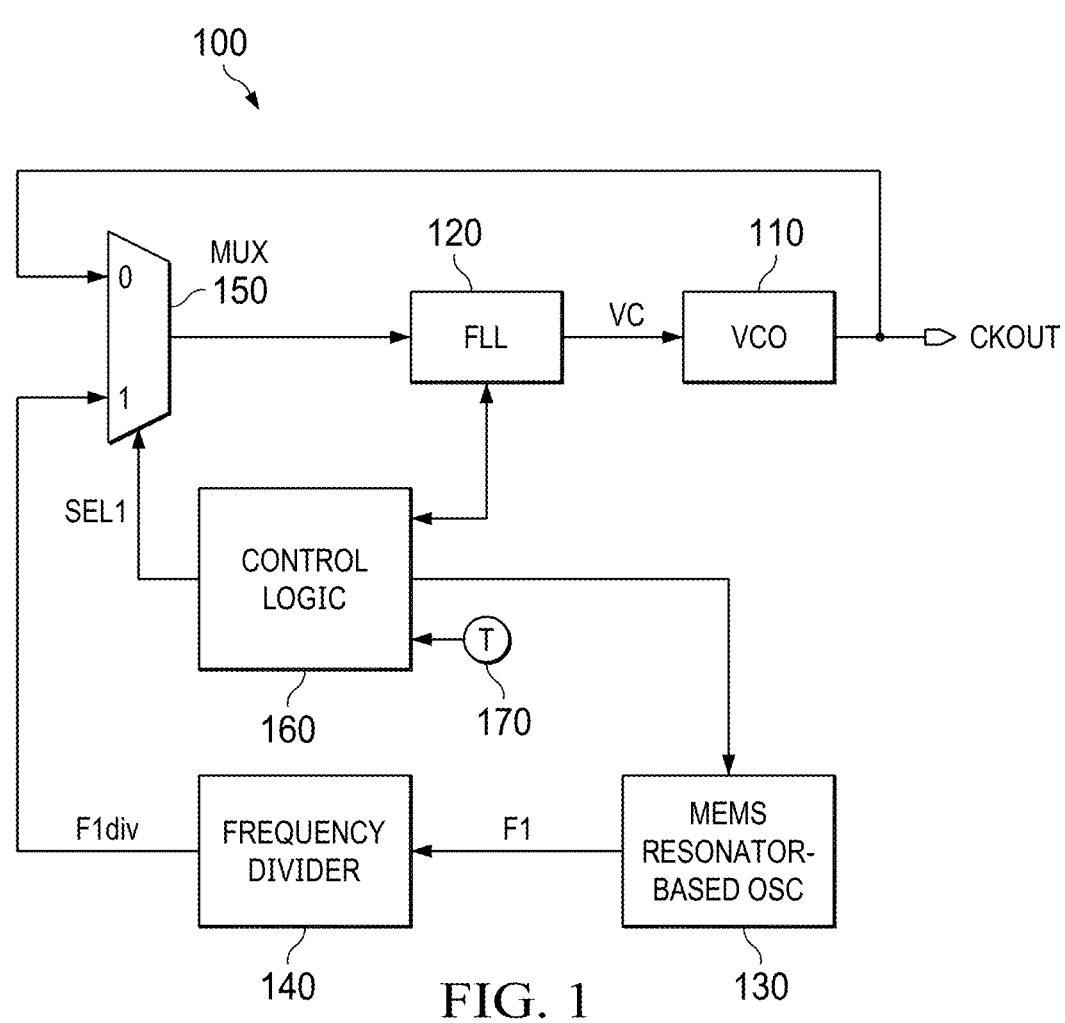
FIG. 1 is a block diagram of a clock circuit in an example.

The same reference numbers or other reference designators are used in the drawings to designate the same or similar (either by function and/or structure) features.

The embodiments described herein are directed to a clock circuit that includes an oscillator and a microelectromechanical system (MEMS) resonator-based oscillator. The MEMS resonator-based oscillator is used to calibrate the clock circuit. FIG. 1 is a block diagram of a clock circuit 100 in accordance with an example. The clock circuit 100 in FIG. 1 includes a voltage-controlled oscillator (VCO) 110, a frequency-locked loop (FLL) 120, a MEMS resonator-based 130, a frequency divider 140, a selection circuit 150, and control logic 160. The output signal from the VCO 110 is the output clock signal, CKOUT. In one example, the selection circuit 150 is an analog voltage multiplexer having a 0-input and a 1-input. The output clock signal CKOUT is coupled to the 0-input of the selection circuit 150. The MEMS resonator-based oscillator 130 generates a clock signal labeled F1. The frequency of F1 may be substantially higher than the frequency of CKOUT. For example, the frequency of F1 may be 2.5 GHZ, while the frequency of CKOUT may be 32 KHz. The frequency divider 140 receives F1 as an input signal and divides down the frequency of F1 to produce and output clock labeled F1div. The divide ratio implemented by the frequency divider 140 may be such that the frequency of F1div is approximately equal to the frequency of CKOUT. Clock signal F1div is provided to the 1-input of the selection circuit 150.

The control logic 160 generates a selection signal (SEL1) to a control input of the selection circuit. In one logic state (e.g., logic low), the selection signal SEL1 causes the selection circuit to provide the CKOUT clock signal on its 0-input to the selection circuit's output. In the other logic state (e.g., logic high), the selection signal SEL1 causes the selection circuit to provide the F1div clock signal on its 1-input to the selection circuit's output.

When not performing a calibration process (e.g., after completion of the calibration process), the control logic 160 controls the selection circuit 150 so as to provide CKOUT into the input of the FLL 120. The FLL 120 generates an internal reference voltage, VREF (shown in FIGS. 2-4). The FLL 120 also generates a second voltage whose amplitude is related to the frequency of CKOUT. The FLL 120 includes an integrator that integrates the difference between VREF and the second voltage. Both voltages are generated in ratio metric fashion from a common reference voltage (e.g., the supply voltage to the circuit). Accordingly, both VREF and the second voltage will provide some tracking and some robustness to variations in the supply voltage. Nominally, the reference voltage is set at a level such that the second voltage is approximately equal to VREF when the frequency of CKOUT is at its target frequency. Any deviation of the frequency of CKOUT from its target frequency will cause the integrator to vary the magnitude of the output control voltage (VC). Changes in the magnitude of the control voltage VC causes the VCO 110 to vary the frequency of CKOUT. This forms a negative feedback loop that forces the frequency of CKOUT to a specific and stable frequency as determined by the FLL internal reference voltage and the internal components of the FLL (e.g., a resistor and capacitor-based time constant reference).

Due to, for example, temperature variation, the frequency of CKOUT may drift from its target level as a result of the FLL internal components or reference voltage drifting with temperature. The control logic 160 may initiate a calibration process to cause the frequency of CKOUT to be brought closer to its target level. The calibration process may be implemented on a periodic basis by the control logic 160 (e.g., once every 5 seconds, once every minute, once every hour, etc.). In addition to, or instead of, the periodic performance of the calibration process, the control logic 160 may initiate the calibration process in response to a change in temperature (as indicated by a temperature signal from a temperature sensor 170) by more than threshold temperate change.

The control logic 160 initiates a calibration process by changing the logic state of selection signal SEL1 to cause the selection circuit 150 to discontinue providing CKOUT to the FLL 120, and instead provide F1div form the MEMS resonator-based oscillator 130 (via frequency divider 140) to the FLL 120. The frequency of clock signal F1 generated by the MEMS resonator-based oscillator 130 is highly accurate and has a much smaller temperature coefficient than the clock signal CKOUT generated by VCO 110. However, the MEMS resonator-based oscillator 130 may consume much more power than the VCO 110. Accordingly, the VCO 110 with its lower power consumption is used to generate CKOUT, but the MEMS resonator-based oscillator 130 is used relatively infrequently for calibration purposes. In one example, an active circuit attached to the resonator of the MEMS resonator-based oscillator 130 is powered down (e.g., by the control logic 160 causing the supply voltage to the active circuit to be turned off) when the calibration process is not being performed. During the calibration process, the control logic 160 wakes up the active circuit of the MEMS resonator-based oscillator 130, and the FLL 120 adjusts the magnitude of its internal reference voltage, VREF, based on the clock signal F1div. By repeatedly adjusting the magnitude of VREF within the FLL 120, the MEMS resonator-based oscillator 130 ensures that the frequency of CKOUT produced by the VCO 110 remains approximately equal to the target frequency.

Figure 2:
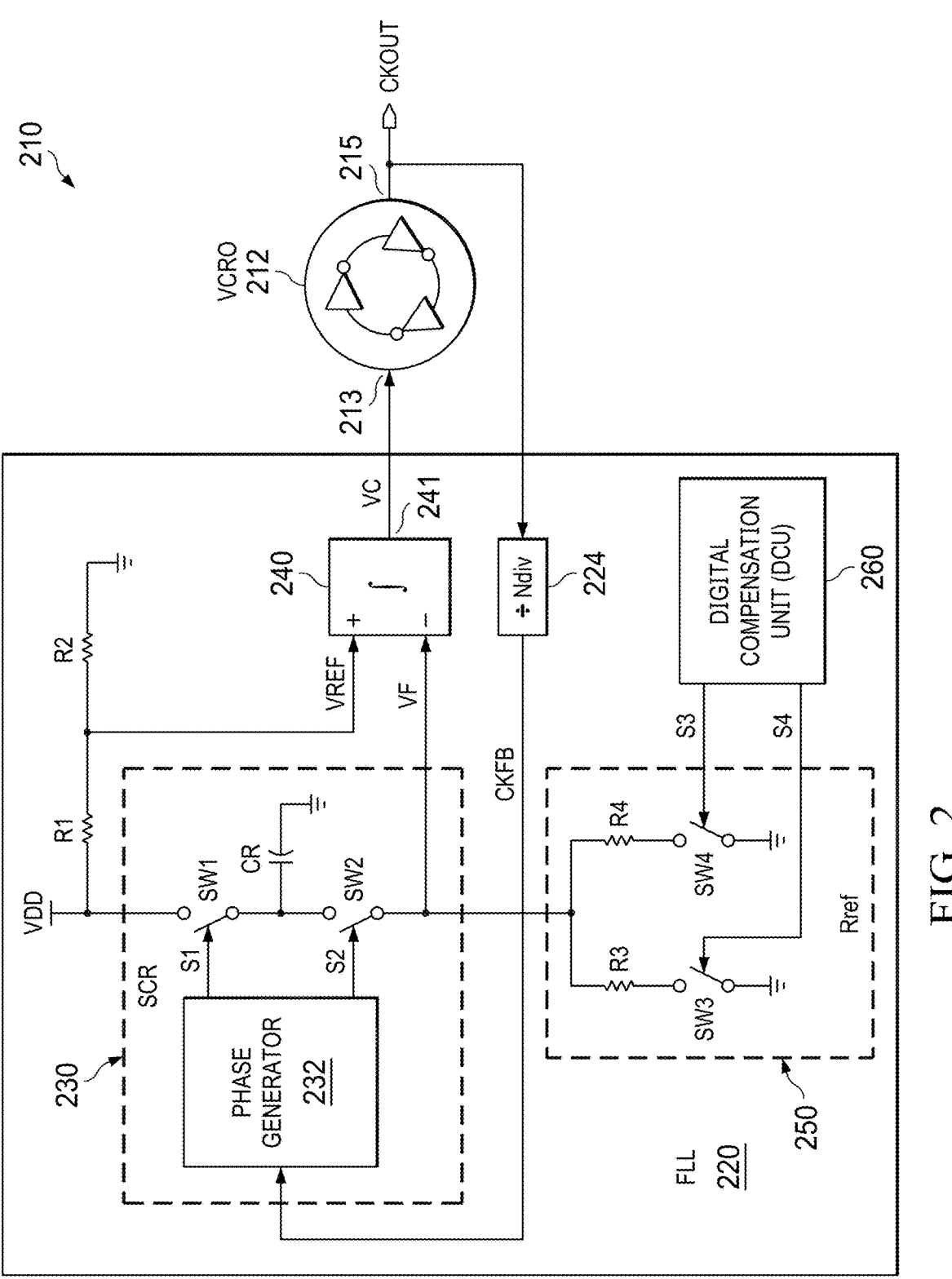
FIG. 2 is a schematic of a clock circuit that includes a switched-capacitor resistor and a voltage-controlled ring oscillator in an example.

The VCO 110 of FIG. 1 may be implemented as a voltage-controlled ring oscillator (VCRO). The FLL 120 may include a switched-capacitor resistor coupled to a reference resistor. FIG. 2 is a schematic of a clock circuit 210 that includes a VCRO 212 and an FLL 220. The FLL 220 includes a switched-capacitor resistor 230, a reference resistor 250, voltage divider formed by series-connected resistors R1 and R2, an integrator 240, a frequency divider 224, and a digital compensation unit (DCU) 260. The series-connected resistors R1 and R2 generates a reference voltage, VREF. The calibration components (e.g., the MEMS resonator-based oscillator 130) are not shown in FIG. 2.

In this example, the reference resistor 250 is implemented as resistors R3 and R4 and switches SW3 and SW4. The switches SW3 and SW4 may be implemented as transistors. Resistor R3 and switch SW3 are coupled in series between the SCR 230 and ground. Similarly, resistor R34 and switch SW4 are coupled in series between the SCR 230 and ground. A digital compensation unit (DCU) 260 asserts control signals S3 and S4 to switches SW3 and SW4, respectively. The DCU 260 turns ON (closes) only one of the switches SW3 and SW4 at a time. When switch SW3 is closed, current flows from the SCR 230 through resistor R3 to ground. When switch SW4 is closed, current flows from the SCR 230 through resistor R4 to ground. Resistor R3 may have a negative temperature coefficient (TC), and resistor R4 may have a positive TC. By alternating between resistors R3 and R4, the DCU 260 implements chopping to help reduce the low frequency/flicker noise of operational amplifiers within the integrator 240.

The SCR 230 includes a phase generator 232, switches SW1 and SW2, and a capacitor CR. The switches SW1 and SW2 are coupled in series between the supply voltage, VDD, and the reference resistor Rref 250. The capacitor CR is coupled between the connection point between switches SW1 and SW2 and ground, as shown. The VCRO 212 produces the output clock, CKOUT, on its clock output 215. A frequency divider 224 may be included to divide down the frequency of the output clock CKOUT (by a factor Ndiv). The divided down clock, CKFB, is provided to an input of the phase generator 232.

The phase generator 232 produces control signals S1 and S2 at a frequency approximately equal to the frequency (FOUT) of the output clock CKOUT. Control signals S1 and S2 control the respective switch SW1 and SW2. By switching the lefthand terminal of capacitor CR between VDD (when switch SW1 is closed) and the upper terminal of the reference resistor Rref 250 (when SW2 is closed), the average resistance (RSCR) of the SCR 230 between Vdd and the upper terminal of the reference resistor Rref 250 is approximately equal to [(Ndiv)/(FOUT*CR)]. Accordingly, the resistance of SCR 230 is inversely proportional to FOUT. The average resistance of the SCR 230 is in series with the reference resistor Rref between VDD and ground. the series combination of the SCR 230 and the reference resistor 250 forms a voltage divider whose output voltage is VF. Voltage VF is approximately equal to [(Rref)/(Rref+ RSCR)]. The frequency FOUT of output clock CKOUT is controlled by the FLL to remain at approximately a certain target frequency (e.g., 32 KHz). If FOUT increases, RSCR will decrease due to its inverse relationship with FOUT. As RSCR decreases, VF will increase. If FOUT decreases, RSCR will increase, and VF will decrease. Voltage VF is thus a frequency-dependent voltage.

The integrator 240 has a positive (+) input and a negative (−) input. The negative input is coupled to the SCR 230 and to the reference resistor Rref 250 and receives voltage VF. The positive input of the integrator 240 is coupled to resistors R1 and R2 and receives the reference voltage, VREF. The integrator 240 integrates the difference between the reference voltage VREF and the frequency-dependent voltage VF to produce a control voltage VC at the integrator's control output 241, which is the control output of the FLL. The control voltage VC is coupled to a control input 213 of the VCRO 212. The VCRO 212 adjusts the frequency FOUT of the output clock CKOUT based on the magnitude of the control voltage VC. The VCRO 212 responds to an increase in VC by increasing FOUT and responds to a decrease in VC by decreasing FOUT. Thus, as FOUT increases, the SCR 230 switches at a faster rate thereby decreasing its average resistance and causing an increase in the magnitude of VF. The integrator produces a smaller magnitude control voltage VC on its output 241, and the VCRO 212 responds to a smaller VC by decreasing the frequency FOUT of the output clock CKOUT. As FOUT decreases, the SCR 230 switches at a slower rate thereby increasing its average resistance which causes a decrease in the magnitude of VF. The integrator produces a smaller magnitude control voltage VC on its output 241, and the VCRO 212 responds to a larger VC by increasing the frequency FOUT of the output clock CKOUT. In this manner, the FLL 220 implements a control loop that is operative to maintain the frequency-dependent voltage VF approximately equal to the reference voltage VREF.

Figure 3:
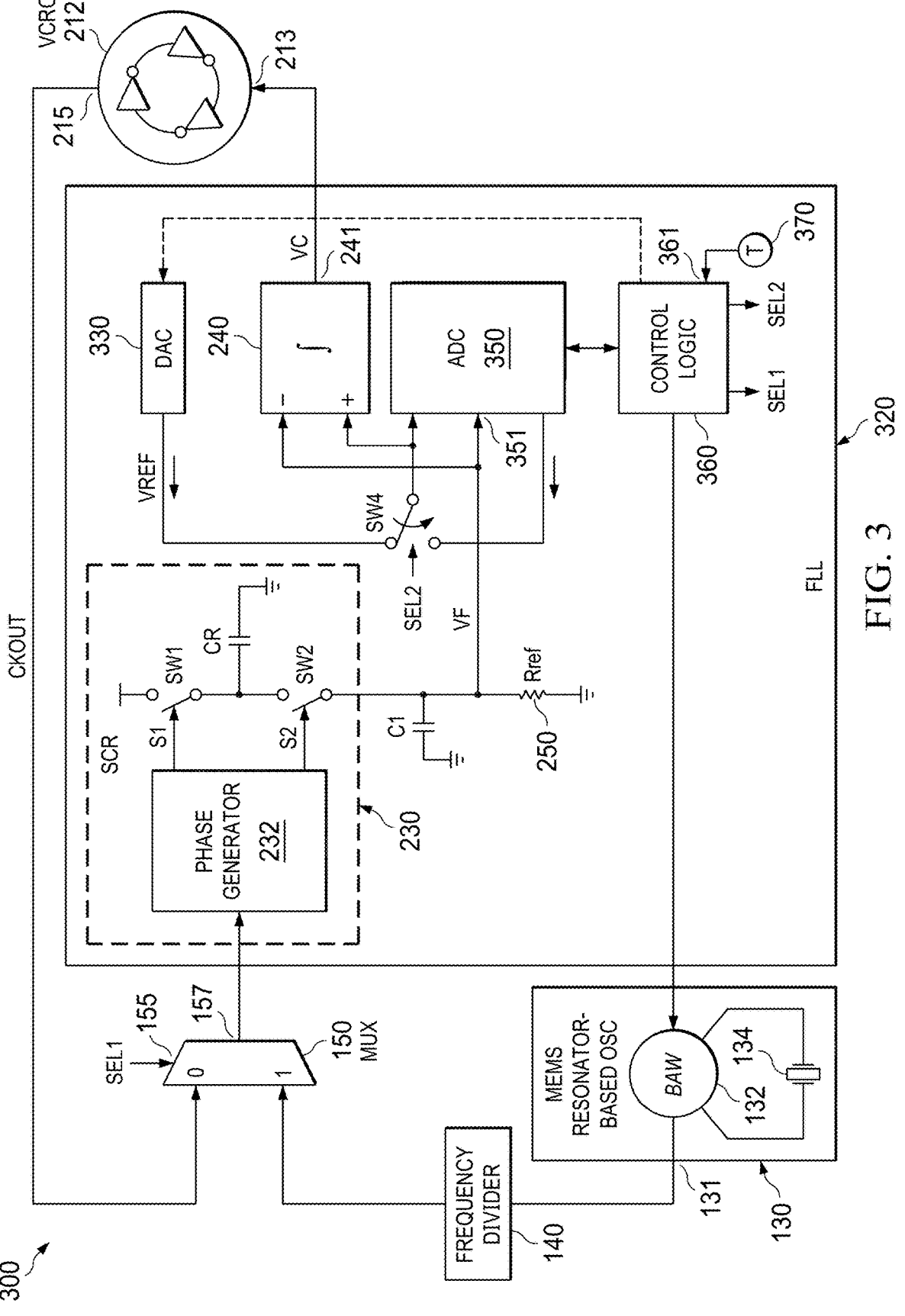
FIG. 3 is a schematic of a clock circuit that a frequency-locked loop (FLL), a voltage-controlled ring oscillator, and a microelectromechanical system (MEMS) resonator-based oscillator to calibrate the FLL in an example.

FIG. 3 is a schematic of a clock circuit 300 that includes most of the components described above with respect to FIG. 2 and also includes components to calibrate the FLL. In the example of FIG. 3, the clock circuit 300 includes an FLL 320, the VCRO 212, the MEMS resonator-based oscillator 130 (which includes a resonator 132 (e.g., a bulk acoustic wave (BAW) resonator) coupled to an active circuit 134 to generate a clock), a frequency divider 140, and multiplexer 150. The FLL 320 includes the SCR 230, the reference resistor Rref 250, and the integrator 240. A capacitor C1 is coupled in parallel with resistor Rref 250 to help smooth the voltage VF from the switching activity of switches SW1 and SW2. The FLL 320 also includes a digital-to-analog converter (DAC) 330, an analog-to-digital converter (ADC) 350, and control logic 360. The implementation of the reference resistor Rref 250 includes the switches SW3 and SW4, resistors R3 and R4, and DCU 260 but not shown in FIG. 3. The ADC 350 may be implemented as any suitable type of ADC such as a sigma-delta ADC. The DAC 330 may be implemented as any suitable type of DAC such as a sigma-delta DAC. In this example, the control logic 360 has a temperature input 361 coupled to a temperature sensor 370. The DAC 330 functions as a reference voltage generator, instead of the voltage divider of resistors R1 and R2 in FIG. 2, to generate the reference voltage, VREF, as is described herein.

Figure 4:
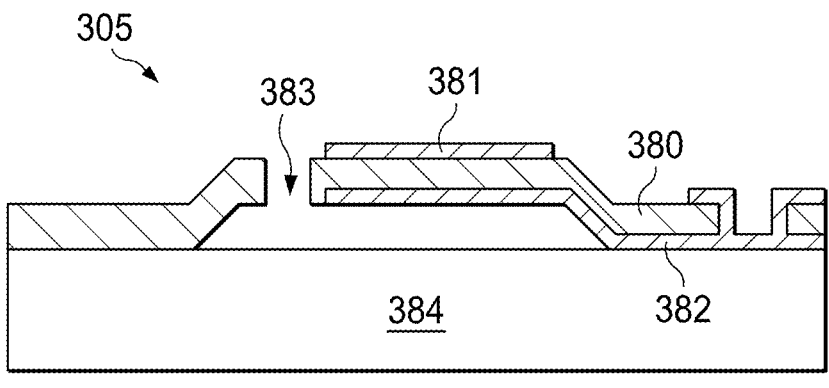
FIG. 4 is cut-away view of a bulk acoustic wave (BAW) resonator in an example.

In the example of FIG. 3, the MEMS resonator-based oscillator 130 is a bulk acoustic wave (BAW) resonator 305. FIG. 4 shows an example construction of 305 BAW resonator. In this example, BAW resonator 305 includes a piezo electric film 381 sandwiched between two metal films 381 and 382. Reflector layers 383 may comprise alternating layers of differentiated acoustic velocity, one-quarter wavelength in thickness, providing a reflectance approaching the performance of a free surface. Substrate 384 may be constructed of quartz, glass, alumina, sapphire, and silicon, among other materials. Properties of the BAW resonator are selected to store acoustic energy within the structure, achieving a high electrical Q. The boundary conditions outside of the metal films maintain a relatively high level of acoustic reflection with vacuum being the ideal interface.

Referring back to FIG. 3, the control logic 360 may be implemented as a finite state machine (FSM) including electrical components such as logic gates, flip-flops, registers, memory, etc.). The control logic 360 has input coupled to the digital output of the ADC 350. As the ADC 350 converts analog input voltages to digital codes, the controller 360 may receive the digital codes from the ADC and forward one or more of those digital codes to the DAC 330 for conversion back to an analog voltage as the reference voltage, VREF. In some embodiments, the control logic 360 may modify the ADC's digital codes based on the temperature signal from the temperature sensor 370 and provide the modified digital codes to the DAC 330. In one example, the control logic 360 may include a look-up table (LUT) usable to modify the ADC's digital codes based on temperature signals from the temperature sensor to thereby correct for any temperature dependence of the BAW resonator itself.

The control logic 360 generates control signals SEL1 and SEL2. Multiplexer 150 includes a selection input 155 and multiplexer inputs "0" and "1." The control logic 360 controls the logic level of the control signal SEL1 to cause the multiplexer to provide a signal from either its 0-input to the multiplexer's output 157 (e.g., SEL1 being logic low) or its 1-input to the multiplexer's output (e.g., SEL1 being logic high). During non-calibration operation of the clock circuit 300, the control logic 360 asserts control signal SEL1 to a logic state that causes multiplexer 150 to provide the signal on its 0-input to the phase generator 232. The clock output 215 from the VCRO 212 is coupled to the multiplexer's 0-input (possibly through a frequency divider such as the frequency divider 224 in the example of FIG. 2), and thus the output clock CKOUT is provided to the input of the phase generator 232 during non-calibration operation. During a calibration process, the control logic 360 asserts control signal SEL1 to a logic level to cause the multiplexer 150 provide the signal on its 1-input to the phase generator 232. The output 131 of the MEMS resonator-based oscillator 130 is a clock output that is coupled, via frequency divider 140, to the 1-input of the multiplexer 150. Thus, during calibration, the MEMS resonator-based oscillator's output clock is coupled to the input of the phase generator 232. The divide ratio implemented by the frequency divider 140 is a value such that the frequency of the frequency divider's output clock is approximately equal to FOUT (assuming the FLL 320 is properly calibrated).

Frequency-dependent voltage VF produced by the combination of the SCR 230 and reference resistor Rref 250 is coupled to the negative input of the integrator 240 and to an analog input 351 of the ADC 350. Switch SW4 is a representation of the case of a Sigma-Delta ADC and a Sigma-Delta DAC. This implementation assumes a single-bit quantizer for both, and so, for the DAC, switch SW4 permits switching between 0 and V_FULL_SCALE fast to create the required VREF, whereas for the ADC, the switch (controlled by SEL2 from the control logic 360) either subtracts 0 or V_FULL_SCALE as per Sigma-Delta ADC operations. Both the ADC and DAC use the same main V_FULL_SCALE (or reference), so that if this reference itself drifts, the relation between the ADC and DAC will remain the same, hence eliminating any errors in the process itself.

During normal operation (not a calibration process), the control logic 360 generates control signal SEL1 to cause the multiplexer 150 to provide the output clock CLOUT to the input of the phase generator 232. A frequency divider may be coupled between the VCRO's output 215 and the 0-input of the multiplexer 150 to divide down the output clock CKOUT. As described above, during normal operation, the phase generator 232 alternately activates control signals S1 and S2 at a frequency that is proportional to the frequency FOUT of the output clock CKOUT. As a result of the activation of the switches SW1 and SW2 at a frequency proportional to FOUT, the average resistance Rscr of the SCR 230 is inversely proportional to FOUT. The voltage VF varies as well based on changes to the SCR's resistance Rscr. The integrator 240 integrates the difference between VREF and VR to generate the control voltage VC for the VCRO 212. The reference voltage VREF is generated by DAC 330 based on a previous calibration process. The calibration process is described below.

The control logic 360 may initiate a calibration process periodically (e.g., every 5 seconds, every minute, every hour, etc.), in response to a temperature change by more than a threshold amount (e.g., a percentage temperature change, a certain number of degrees of temperature change, etc.), or a combination of both periodic calibration processes but also calibration processes activated by temperature changes. The control logic 360 initiates a calibration process by generating the control signal SEL1 to cause multiplexer 150 to provide the MEMS resonator-based oscillator output clock (as divided down by the frequency divider 140) to the phase generator 232 instead of CKOUT.

The BAW resonator's output clock is a more accurate (e.g., less temperature variation) than the VCRO's output clock CKOUT. The phase generator 232 operates the switches SW1 and SW2 of the SCR 230 based on the frequency of the BAW resonator's output clock. The SCR 230 produces the voltage VF based on the BAW resonator's output clock. Because the BAW resonator produces a more accurate clock than the VCRO 212, the magnitude of voltage VF during calibration may change but only slightly if the capacitance of capacitor CR and/or the resistance of resistor Rref change due to temperature, stress, or aging.

The ADC 350 converts the voltage VF (produced using the BAW resonator output clock) to a digital code. The digital code is received by the control logic 360 and forwarded on to the DAC 330. The control logic 360 may modify the digital code based on temperature, as described above. The DAC 330 converts the digital code from the ADC 350 back to an analog voltage, which is the reference voltage VREF used by the integrator 240. In this manner, the BAW resonator 130 calibrates the FLL 320 and, in particular, calibrates the reference voltage used by the integrator 240 of the FLL 320. After the calibration process completes, the control logic 360 changes the logic states of control signals SEL1 and SEL2 back so that the VCRO's output clock CKOUT is again provided through the multiplexer 150 to the input of the phase generator 232. The calibration process may end based on a timer (a time-based calibration).

Figure 5:
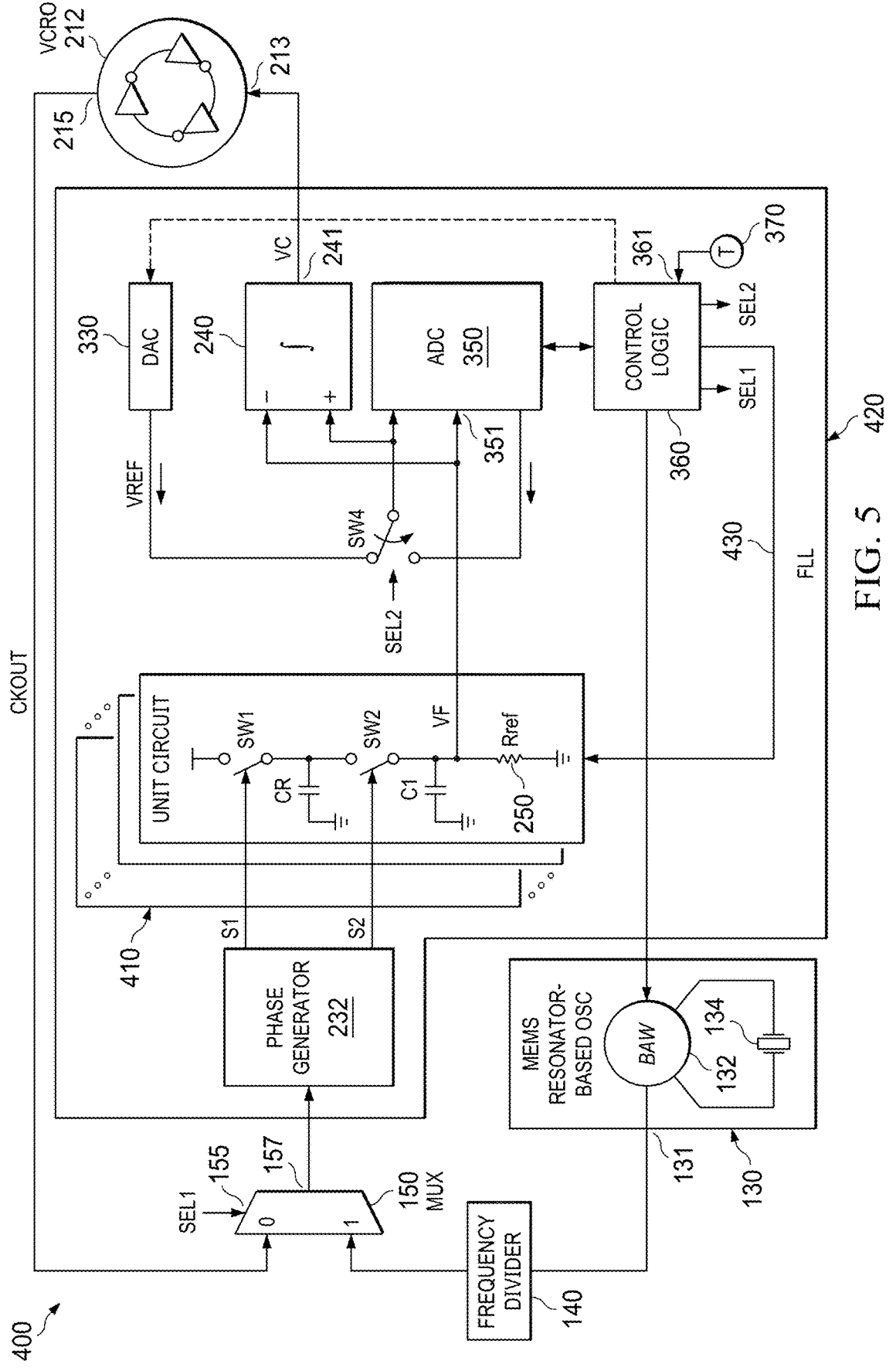
FIG. 5 is a schematic of a clock circuit that a frequency-locked loop (FLL), a voltage-controlled ring oscillator, and a microelectromechanical system (MEMS) resonator-based oscillator to calibrate the FLL in another example.

FIG. 5 is a schematic of a clock circuit 400 that is largely the same as the clock circuit 300 of FIG. 3. A difference of clock circuit 400 relative to clock circuit 300 is that clock circuit 400 includes multiple instances of the combination of switches SW1 and SW2, capacitor CR, and the reference resistor 250. Each instance of such components is referred to herein as a "unit circuit" 410. Each unit circuit 410 includes a pair of switches (e.g., SW1 and SW2) coupled in series between VDD and a reference resistor (e.g., Rref 250) and a capacitor (e.g., capacitor CR) coupled between the connection point of the switches and ground.

During calibration of the FLL, the control logic 360 asserts control signals 430 to the unit circuits 410 to select some or all of the unit circuits 410 to collectively generate the voltage VF to the ADC 350 and to the integrator 240. When all of the unit circuits 410 are selected, their reference resistors Rref 250 are coupled in parallel and the Rscr of the switched-capacitor resistors are coupled in parallel. With multiple (e.g., 10) unit circuits 410 coupled in parallel during calibration, the noise power of the collective unit circuits 410 is substantially less than if only a single Rscr were coupled to a single reference resistor Rref 250, and thus the calibration is much more accurate.

During normal operation (non-calibration), the control logic 360 asserts control signals 430 to the unit circuits 410 to select only one of the unit circuits at a time to provide the voltage VF to the integrator 240. The control logic 360 may select each of the unit circuits 410 in a round-robin fashion. In one example, the control logic 360 may implement, or be coupled to, a counter that sequences through unit circuit 410 for a defined period of time (e.g., 10 milliseconds for each unit circuit 410). The reference resistors of the multiple unit circuits will not necessarily all match, and similarly, the SCR resistances of the unit circuits will not exactly match. However, over the course of a longer period of time (e.g., one second or one minute), those differences will average out (e.g., some resistances may be higher, and some may be smaller), and thus the accuracy of voltage VF may be improved relative to only having a single Rscr/Rref resistor pair.

Figure 6:
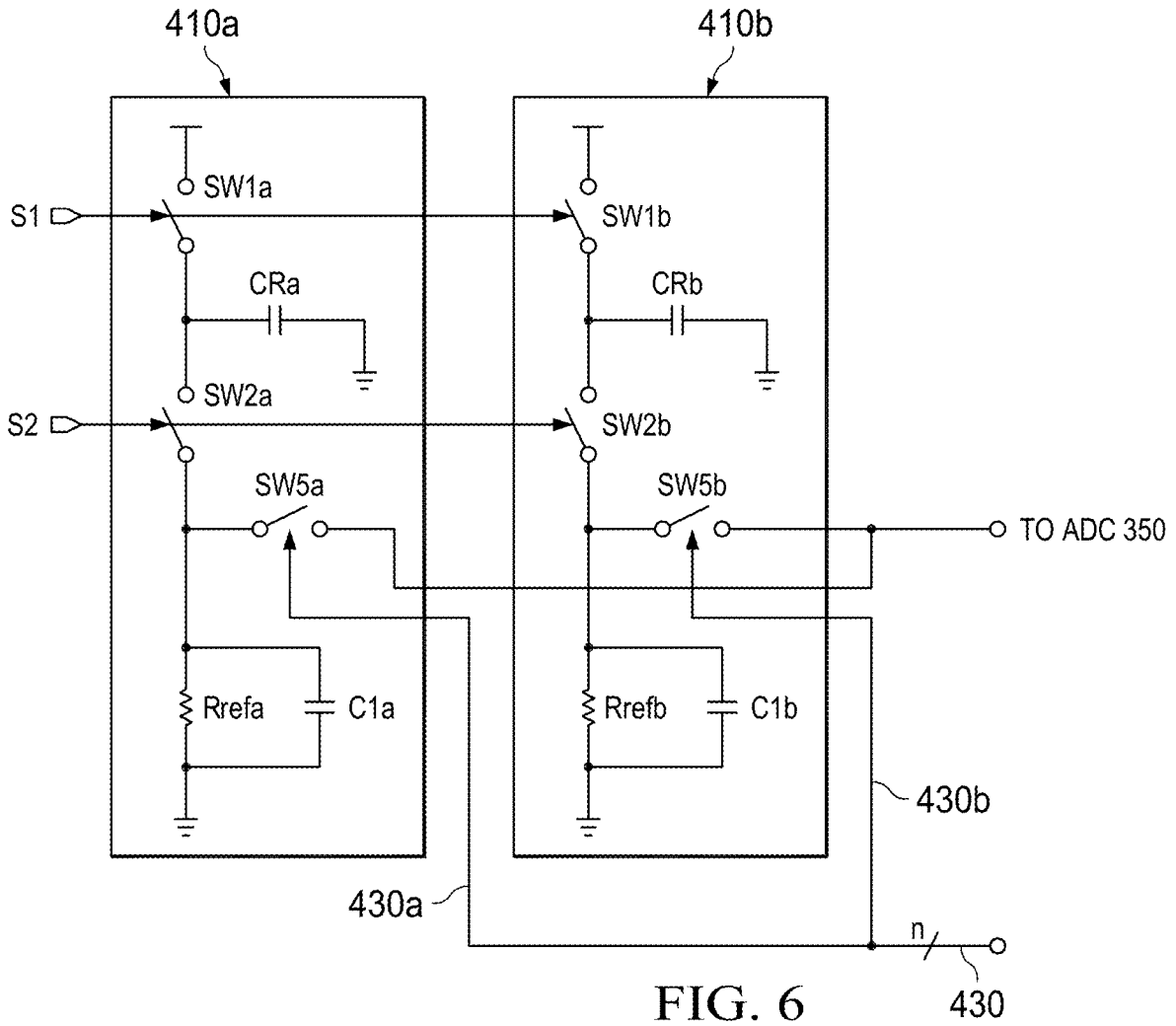
FIG. 6 is an example of multiple switched-capacitor resistors and reference resistors usable in the example clock circuit of FIG. 5.

FIG. 6 shows an example of two unit circuits 410a and 410b, although a different number (e.g., 10) can be included for the clock circuit 400 of FIG. 5. Unit circuit 410a includes switches SW1a and SW2a coupled in series and to a capacitor CRa. A reference resistor Rrefa is coupled between switch SW2a and ground, and a capacitor C1a is coupled in parallel with reference resistor Rrefa. A switch SW5a is coupled between the connection point between switch SW2a and reference resistor Rrefa and the ADC 350. Similarly, unit circuit 410b includes switches SW1b and SW2b coupled in series and to a capacitor CRb. A reference resistor Rrefb is coupled between switch SW2b and ground, and a capacitor C1b is coupled in parallel with reference resistor Rrefb. A switch SW5b is coupled between the connection point between switch SW2b and reference resistor Rrefb and the ADC 350. Control signals 430 includes n control signals 430a and 430b. The value n is equal to the number of unit circuits 410. I this example, n equals 2. Control signal 430a controls the state of switch SW5a, and control signal 430b controls the state of switch SW5b.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. An apparatus comprising:
an oscillator having a control input and a clock output;
a frequency control circuit having an input and a control output, the control output coupled to the control input;
a reference clock generator having a reference clock output; and
a multiplexer having a first multiplexer input, a second multiplexer input, a selection input, and a multiplexer output, the first multiplexer input coupled to the clock output, the second multiplexer input coupled to the reference clock output, and the multiplexer output coupled to the input of the frequency control circuit.

2. The apparatus of claim 1, wherein the oscillator and the reference clock generator have different frequency variations with respect to a physical condition.

3. The apparatus of claim 2, wherein the physical condition includes at least one of: a respective temperature of each of the oscillator and the reference clock generator, a respective stress received by each of the oscillator and the reference clock generator, or a respective age of each of the oscillator and the reference clock generator.

4. The apparatus of claim 1, wherein the oscillator includes a voltage-controlled oscillator (VCO).

5. The apparatus of claim 4, wherein the VCO includes a ring oscillator.

6. The apparatus of claim 1, wherein the reference clock generator includes a microelectromechanical system (MEMS) resonator.

7. The apparatus of claim 6, wherein the MEMS resonator includes a bulk acoustic wave (BAW) resonator.

8. The apparatus of claim 1, wherein the oscillator and the reference clock generator have different temperature coefficients.

9. The apparatus of claim 1, wherein the frequency control circuit includes a first circuit configured to:
convert a clock signal at the input to a first voltage; and
provide a frequency control signal at the control output based on the first voltage and a reference voltage.

10. The apparatus of claim 9, further comprising control logic coupled to the multiplexer and configured to:
in a first mode, control the multiplexer to connect the reference clock output to the input of the frequency control circuit to set the reference voltage based on the first voltage; and
in a second mode, control the multiplexer to connect the clock output to the input of the frequency control circuit to set the frequency control signal based on a difference between the first voltage and the reference voltage.

11. The apparatus of claim 10, wherein the frequency control circuit includes:
a phase generator having an input coupled to the input of the frequency control circuit;
a resistor coupled to a ground terminal;
a switched-capacitor resistor (SCR) coupled between a power supply and the resistor, the SCR having inputs coupled to outputs of the phase generator, the phase generator, the switched-capacitor resistor, and the resistor configured to provide the first voltage;
a digital-to-analog converter (DAC) coupled to the control logic and configured to provide the reference voltage; and
an integrator coupled to an output of the DAC and the SCR, the integrator having an output coupled to the output of the frequency control circuit and configured to provide the frequency control signal based on integrating the difference between the first voltage and the reference voltage.

12. The apparatus of claim 11, further comprising a temperature sensor coupled to at least one of the control logic or the DAC, wherein the at least one of the control logic or the DAC is configured to adjust the reference voltage based on a signal from the temperature sensor.

13. The apparatus of claim 11, further comprising an analog-to-digital converter (ADC) having an input coupled to the SCR and an output coupled to the control logic, the ADC configured to convert the first voltage to digital values, and provide the digital values to the control logic; and
wherein the control logic is configured to, in the second mode, provide the digital values to the DAC to generate the reference voltage.

14. The apparatus of claim 13, wherein the ADC and the DAC are part of a sigma-delta modulator.

15. The apparatus of claim 11, wherein the SCR is a first SCR, the resistor is a first resistor, and the frequency control circuit includes a second resistor coupled to the ground terminal and a second SCR coupled between the power supply and the second resistor, the second SCR has inputs coupled to the outputs of the phase generator; and
wherein the control logic is configured to:
in the first mode, connect the first SCR, the second SCR, the first resistor, and the second resistor to the integrator to provide the first voltage; and
in the second mode, disconnect the second SCR and the second resistor from the integrator.

16. The apparatus of claim 1, further comprising a frequency divider coupled between the reference clock output and the second multiplexer input.

17. The apparatus of claim 1, wherein the oscillator, the frequency control circuit, the reference clock generator, and the multiplexer are part of an integrated circuit, the integrated circuit further comprising a second circuit having a clock input coupled to the clock output.

18. An integrated circuit (IC), comprising:

a clock circuit having a first output, the clock circuit including:

an oscillator having a control input and a clock output;

a frequency control circuit having an input and a control output, the control output coupled to the control input;

a reference clock generator having a reference clock output; and a multiplexer having a first multiplexer input, a second multiplexer input, a selection input, and a multiplexer output, the first multiplexer input coupled to the clock output, the second multiplexer input coupled to the reference clock output, and the multiplexer output coupled to the input of the frequency control circuit; and a second circuit having a clock input coupled to the clock output.

19. The IC of claim 18, wherein the oscillator and the reference clock generator have different frequency variations with respect to a physical condition.

20. The IC of claim 19, wherein the physical condition includes at least one of: a respective temperature of each of the oscillator and the reference clock generator, a respective stress received by each of the oscillator and the reference clock generator, or a respective age of each of the oscillator and the reference clock generator.

21. The IC of claim 18, wherein the reference clock generator includes a BAW resonator.

* * * * *